(12) United States Patent
Kim et al.

(10) Patent No.: US 11,656,285 B2
(45) Date of Patent: May 23, 2023

(54) METHOD FOR JUDGING A LOW VOLTAGE DEFECT IN A LITHIUM SECONDARY BATTERY

(71) Applicants: Hyundai Motor Company, Seoul (KR); Kia Corporation, Seoul (KR)

(72) Inventors: Dong Hui Kim, Gyeonggi-do (KR); Se Young Lee, Seoul (KR); Dong Ju Lee, Gyeonggi-do (KR)

(73) Assignees: Hyundai Motor Company, Seoul (KR); Kia Corporation, Seoul (KR)

( * ) Notice: Subject to any disclaimer, the term of this patent is extended or adjusted under 35 U.S.C. 154(b) by 0 days.

(21) Appl. No.: 17/455,765

(22) Filed: Nov. 19, 2021

(65) Prior Publication Data
US 2022/0381833 A1    Dec. 1, 2022

(30) Foreign Application Priority Data
May 24, 2021    (KR) .......................... 10-2021-0066405

(51) Int. Cl.
*G01R 31/374*    (2019.01)
*G01R 31/3835*    (2019.01)
(52) U.S. Cl.
CPC ....... *G01R 31/374* (2019.01); *G01R 31/3835* (2019.01)

(58) Field of Classification Search
None
See application file for complete search history.

(56) References Cited

U.S. PATENT DOCUMENTS

2022/0077491 A1*    3/2022    Kim .................... G01R 31/388

FOREIGN PATENT DOCUMENTS

| JP | 2001-228224 A | 8/2001 |
| KR | 10-1779245 B1 | 9/2017 |
| KR | 10-2018-0080914 A | 7/2018 |

* cited by examiner

*Primary Examiner* — Jas A Sanghera
(74) *Attorney, Agent, or Firm* — Fox Rothschild LLP

(57) ABSTRACT

A method for determining a low voltage defect of a lithium secondary battery is provided. The method includes measuring a primary voltage of a lithium secondary battery whose formation process has been completed, transporting the lithium secondary battery, measuring temperatures to which the lithium secondary battery has been exposed during the transporting process, measuring a secondary voltage of a lithium secondary battery whose transporting has been completed, revising the secondary voltage to calculate a corrected secondary voltage based on the temperature to which the lithium secondary battery has been exposed, and comparing the primary voltage and the corrected secondary voltage to determine whether the lithium secondary battery is defective.

6 Claims, 5 Drawing Sheets

FIG. 3

| | Temperature (°C) | | | | | | | |
|---|---|---|---|---|---|---|---|---|
| | 15 | 20 | 25 | 30 | 35 | 40 | 45 |
| 0 day | | | Primary voltage | | | | |
| 5 day | $OCV_{15,5d}$ | $OCV_{20,5d}$ | $OCV_{25,5d}$ | $OCV_{30,5d}$ | $OCV_{35,5d}$ | $OCV_{40,5d}$ | $OCV_{45,5d}$ |
| 30 day | $OCV_{15,30d}$ | $OCV_{20,30d}$ | $OCV_{25,30d}$ | $OCV_{30,30d}$ | $OCV_{35,30d}$ | $OCV_{40,30d}$ | $OCV_{45,30d}$ |

FIG. 4

| Temperature | 15 | 20 | 25 | 30 | 35 | 40 | 45 |
|---|---|---|---|---|---|---|---|
| $A_T$ | $A_{15}$ | $A_{20}$ | $A_{25}$ | $A_{30}$ | $A_{35}$ | $A_{40}$ | $A_{45}$ |
| $B_T$ | $B_{15}$ | $B_{20}$ | $B_{25}$ | $B_{30}$ | $B_{35}$ | $B_{40}$ | $B_{45}$ |

FIG. 5

| Exposure Period (day) | Temperature (°C) | | | | | | |
|---|---|---|---|---|---|---|---|
| | 15 | ... | 25 | 26 | ... | 44 | 45 |
| 3day | $Q_{15deg, 3day}$ | ... | $Q_{25deg, 3day}$ | ... | ... | ... | $Q_{45deg, 3day}$ |
| 4day | $Q_{15deg, 4day}$ | ... | $Q_{25deg, 4day}$ | ... | ... | ... | $Q_{45deg, 4day}$ |
| ... | ... | ... | ... | ... | ... | ... | ... |
| 29day | $Q_{15deg, 29day}$ | ... | $Q_{25deg, 29day}$ | ... | ... | ... | $Q_{45deg, 29day}$ |
| 30day | $Q_{15deg, 39day}$ | ... | $Q_{25deg, 39day}$ | ... | ... | ... | $Q_{45deg, 39day}$ | ns
METHOD FOR JUDGING A LOW VOLTAGE DEFECT IN A LITHIUM SECONDARY BATTERY

CROSS REFERENCE TO RELATED APPLICATION

The present application claims priority to Korean Patent Application No. 10-2021-0066405, filed May 24, 2021, the entire contents of which is incorporated herein for all purposes by this reference.

BACKGROUND

Field of the Disclosure

The present disclosure relates to a method for judging a low voltage defect in a lithium secondary battery. Specifically, the present disclosure relates to a method for judging a low voltage defect in a lithium secondary battery by reflecting temperature conditions to which a lithium secondary battery is exposed.

Description of the Related Art

A lithium secondary battery is comprised of a cathode, anode, electrolyte and separator, and is completed by, after assembling the components, passing through an initial charge/discharge step and an aging step. The initial charge/discharge step and the aging step are referred to as the formation process, and this formation process is an important process for manifestation and activation of the characteristics of a lithium secondary battery.

In many cases, defects occur due to various causes in a lithium secondary battery on which the formation process has been completed. To sort out defects in lithium secondary batteries, the method primarily used is to sort out low voltage defects during the formation process. However, additional lithium secondary battery defects may arise after the formation process even if a battery has been determined to be normal during the formation process, in the process of transport for forming a battery cell, for example.

Such cases lead to a problem of lithium secondary batteries which should have been sorted out as defective coming to form a battery cell.

SUMMARY

The purpose of the present disclosure is to improve the accuracy of low voltage defect determination for a lithium secondary battery by additionally sorting out lithium secondary battery low voltage defects which arise during transport and storage after manufacture of a lithium secondary battery has been completed and before the lithium secondary battery is used to form a battery cell.

The method for determining a low voltage defect in a lithium secondary battery according to the present disclosure may include: measuring a primary voltage of a lithium secondary battery whose formation process has been completed; transporting the lithium secondary battery; measuring temperatures to which the lithium secondary battery has been exposed during the transporting process; measuring a secondary voltage of a lithium secondary battery whose transporting has been completed; based on the temperature to which the lithium secondary battery has been exposed, revising the secondary voltage to calculate a corrected secondary voltage; and, comparing the primary voltage and the corrected secondary voltage to determine whether the lithium secondary battery is defective.

The primary voltage and the secondary voltage may be measured in an open circuit (OC) state. In measuring exposed temperatures, the mean temperature to which the lithium secondary battery has been exposed may be measured. In calculating the corrected secondary voltage, a secondary voltage calculated by revising the secondary voltage based on the average temperature to which the lithium secondary battery has been exposed may be calculated. In calculating the corrected secondary voltage, the secondary voltage may be corrected by dividing a measured secondary voltage by a correction factor (Q). In determining whether a lithium secondary battery is defective, if the voltage change between the primary voltage and the corrected secondary voltage is greater than a reference value, then battery may be determined to be defective.

According to the present disclosure, an advantageous effect is improved ability to detect lithium secondary batteries with low voltage defect, as whether a lithium secondary battery has a low voltage defect may be determined from after the formation process of the lithium secondary battery until the point in time a battery cell is constructed, and whether a low voltage defect exists may be determined based on temperature conditions.

BRIEF DESCRIPTION OF THE DRAWINGS

FIG. 3 is a table showing data from a preliminary self-discharge test on the lithium secondary battery on which the method for judging a low voltage defect in a lithium secondary battery according to the present disclosure will be carried out.

FIG. 4 is a table calculating the $A_T$ and $B_T$ for carrying out the method for judging a low voltage defect in a lithium secondary battery according to the present disclosure.

FIG. 5 is a table calculating the $Q_T$ for carrying out the method for judging a low voltage defect in a lithium secondary battery according to the present disclosure.

DETAILED DESCRIPTION OF THE DISCLOSURE

Figure 1:
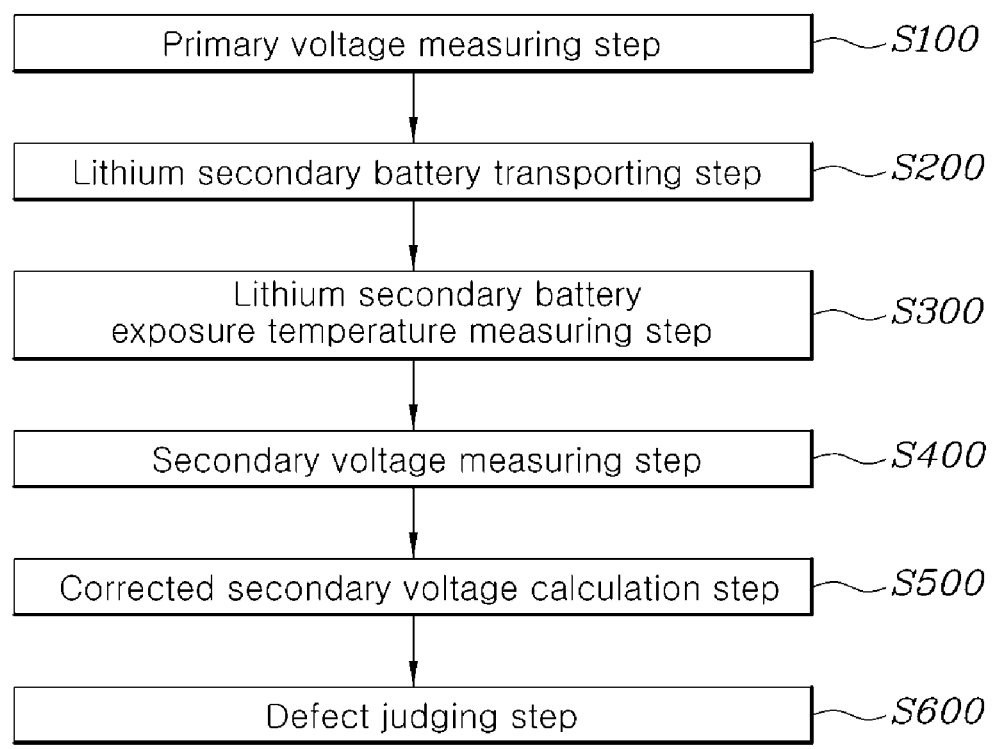
FIG. 1 is a flow chart for the method for judging a low voltage defect in a lithium secondary battery according to the present disclosure.

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, combustion, plug-in hybrid electric vehicles, hydrogen-powered vehicles and other alternative fuel vehicles (e.g. fuels derived from resources other than petroleum).

Although exemplary embodiment is described as using a plurality of units to perform the exemplary process, it is understood that the exemplary processes may also be performed by one or plurality of modules. Additionally, it is understood that the term controller/control unit refers to a hardware device that includes a memory and a processor and is specifically programmed to execute the processes described herein. The memory is configured to store the modules and the processor is specifically configured to execute said modules to perform one or more processes which are described further below.

Unless specifically stated or obvious from context, as used herein, the term "about" is understood as within a range of normal tolerance in the art, for example within 2 standard deviations of the mean. "About" can be understood as within 10%, 9%, 8%, 7%, 6%, 5%, 4%, 3%, 2%, 1%, 0.5%, 0.1%, 0.05%, or 0.01% of the stated value. Unless otherwise clear from the context, all numerical values provided herein are modified by the term "about."

Formation process refers to a step of aging to allow the electrolyte comprising a lithium secondary battery to sufficiently impregnate the battery and allow the electrolyte to become suspended so that movement for insertion and extraction of lithium ion may take place efficiently, and a step of activating the lithium secondary battery by forming a SEI (Solid Electrolyte Interphase) at the anode of the lithium secondary battery.

A number of lithium secondary batteries on which the formation process has been completed come together to form a battery cell, and a battery cell is used as an energy source for electronic devices such as smart phones and laptops, or as a power source for electric vehicles.

Whereas it was conventionally determine in the formation process whether a lithium secondary battery has a low voltage defect, a low voltage defect may occur in a lithium secondary battery due to various causes even after the formation process has been completed, in the process of forming a battery cell with lithium secondary batteries.

Whereas there are various causes for low voltage defects in a lithium secondary battery, some reported causes of a low voltage defect include the separator of a lithium secondary battery becoming thinner due to various reasons, or the separator being penetrated by lithium dendrite.

In other words, if a lithium secondary battery in which a low voltage defect has occurred is used, a short circuit, wherein the cathode and anode come into contact inside the lithium secondary battery, occurs, and may lead to explosion of the lithium secondary battery. Therefore it is very important to sort out lithium secondary batteries in which a low voltage defect has occurred.

Between the point in time the formation process have been completed and the time a lithium secondary battery is transported to form a battery cell as well, a low voltage defect may occur depending on conditions such as temperatures to which the lithium secondary battery is exposed to during transport. Therefore it is necessary to determine whether a low voltage defect has occurred in a lithium secondary battery so that a defective lithium secondary battery is not included in the final battery cell.

The method for determine a low voltage defect in a lithium secondary battery according to the present disclosure, to prevent a lithium secondary battery having a low voltage defect may include: measuring a primary voltage of a lithium secondary battery whose formation process has been completed (S100); transporting the lithium secondary battery (S200); measuring temperatures to which the lithium secondary battery has been exposed during the transporting process (S300); measuring a secondary voltage of a lithium secondary battery whose transporting has been completed (S400); based on the temperature to which the lithium secondary battery has been exposed, revising the secondary voltage to calculate a corrected secondary voltage (S500); and, comparing the primary voltage and the corrected secondary voltage to determine whether the lithium secondary battery is defective (S600).

Meanwhile, the primary voltage and the secondary voltage may be measured in an open circuit (OC) state, and in the measuring of exposed temperatures, the average temperature to which the lithium secondary battery has been exposed may be measured. The primary voltage is the open circuit voltage of the lithium secondary battery as measured at room temperature (e.g., about 15~25° C.) after the formation process has been completed. The measured secondary voltage is an open circuit voltage measured after transport of the lithium secondary battery has been completed, and the corrected secondary voltage is an open circuit voltage calculated by correcting the measured secondary voltage.

In calculating the corrected secondary voltage (S500), a secondary voltage calculated by revising the secondary voltage based on the average temperature to which the lithium secondary battery has been exposed may be calculated. In calculating the corrected secondary voltage, the secondary voltage may be corrected by dividing a measured secondary voltage by a correction factor (Q). In determining whether a lithium secondary battery is defective (S600), in response to determining that the voltage change between the primary voltage and the corrected secondary voltage is greater than a reference value, the battery may be determined to be defective.

Specifically, the uniqueness of the present disclosure lies in that it is carried out after the point in time that a formation process has been completed, and in that a secondary voltage is corrected with consideration for temperature, then compared against a primary voltage to determine whether a battery is defective. The temperature conditions under which a lithium secondary battery forms a battery cell may also influence a voltage decrease in a lithium secondary battery, and generally, the higher the temperature to which a lithium secondary battery is exposed, the greater the voltage drop of the battery. Therefore, if defective lithium secondary batteries are sorted out using voltage drop or voltage decreased rate without giving consideration to temperature conditions, normal lithium secondary batteries may be determined to be defective lithium secondary batteries, leading to economic loss, and defective lithium secondary batteries may be determined to be normal (e.g., without error), causing safety issues.

Figure 2:
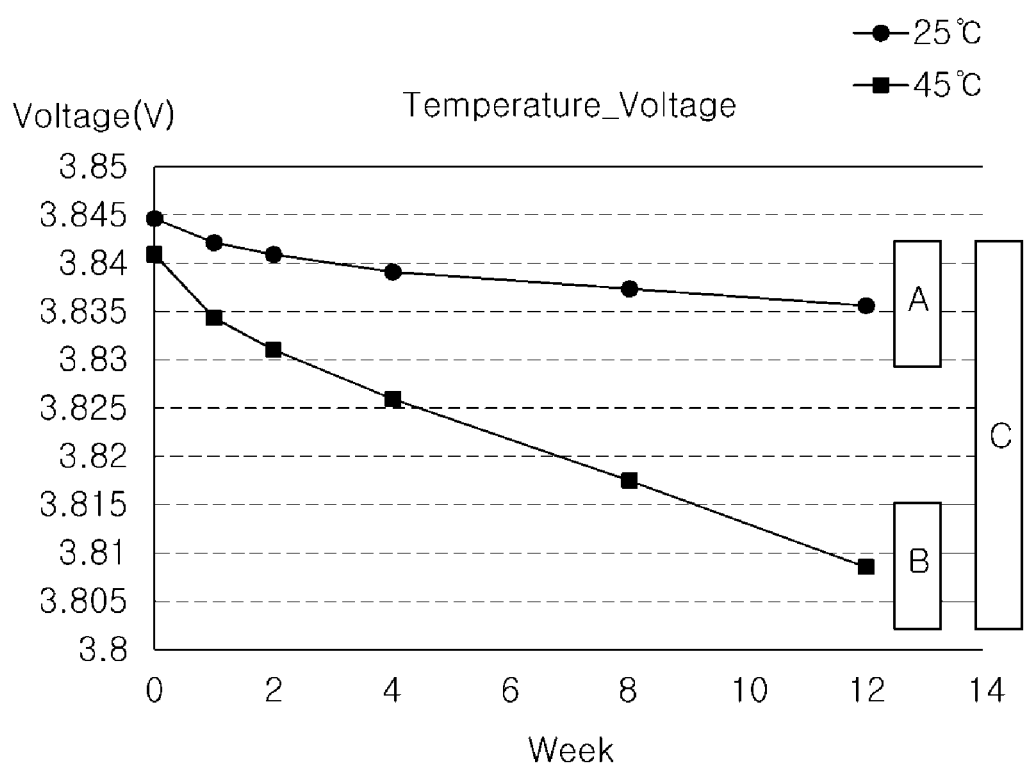
FIG. 2 is a graph illustrating the voltage drop of a lithium secondary battery according to storage temperature.

FIG. 2 is a graph illustrating the voltage drop of a lithium secondary battery according to storage temperature. Explaining the above problem with reference to FIG. 2, as temperature conditions were not given consideration in prior art, lithium secondary batteries in a tentative range A were sorted out as normal lithium secondary batteries. In particular, all lithium secondary batteries below range A are sorted out as defective, and therefore there is the possibility that even normal lithium secondary batteries could be sorted out as defective.

In other words, if a lithium secondary battery stored and transported at 25° C. falls in range B, it has a low voltage defect, but if a lithium secondary battery stored and transported at 45° C. falls in range B, then it does not have a low voltage defect. More self-discharge has occurred than would have at 25° C. simply because the temperature of exposure was higher, and it is difficult to say that such a battery has a low voltage defect. When a tentative sorting method is adopted, a normal lithium secondary battery may be sorted out as defective, as described in the above.

But if all batteries within a range C are sorted out as normal lithium secondary batteries to reduce the number of lithium secondary batteries that are normal but are sorted out as defective, then this causes the problem that defective lithium secondary batteries may be sorted out as normal. Accordingly, temperature conditions need to be accounted for together if the ability to sort out defective lithium secondary batteries is to be improved without causing economic loss.

In determining whether a lithium secondary battery has a low voltage defect, it is difficult to determine whether there is a defect based solely on the absolute deviation of open circuit voltage. Therefore, a relative deviation according to temperature conditions must be considered. In the following, the method for determining a low voltage error according to one embodiment of the present disclosure will be described.

In particular, $OCV_1$ represents the primary voltage, $OCV_2$ represents the secondary voltage, and $OCV_{2corrected}$ represents the corrected secondary voltage. Further, $OCV_{25deg,5d}$ represents the open circuit voltage of a lithium secondary battery which has been self-discharging for 5 days at an average exposure temperature of 25° C., and likewise $OCV_{45deg,30d}$ represents the open circuit of a lithium secondary battery which has been self-discharging for 30 days at an average exposure temperature of 45° C.

$Q_T$ represents a correction factor at an average exposure temperature of T° C.

$A_T$ and $B_T$ are constants, and vary depending on the average exposure temperature T° C.

1) When $OCV_1 - OCV_{2corrected}$ exceeds a reference value, [a battery] is judged to be defective.

$$OCV_1 - OCV_{2corrected} > \text{Reference value}$$

2) The method for finding $OCV_{2corrected}$ may be as follows.

$$OCV_{2corrected} = \frac{OCV_2}{Q_t}$$

3) The method for finding $Q_T$ may be as follows.

$$Q_T = A_{T^*} \text{ Exposure period} + B_T$$

4) The methods for finding $A_T$ and $B_T$ may be as follow.

$$A_T = \left( \frac{OCV_{T,30d}}{OCV_{25,30d}} - \frac{OCV_{T,5d}}{OCV_{25,5d}} \right) \div 25$$

$$B_T = \frac{OCV_{T,5d}}{OCV_{25,5d}} - A_T * 5$$

$A_T$, $B_T$ and $Q_T$ may be found by creating tables such as those shown in FIG. 3 through FIG. 5 (FIG. 3 is a table showing data from a preliminary self-discharge test on a lithium secondary battery on which the method for determining a low voltage defect of a lithium secondary battery according to the present disclosure, FIG. 4 is a table calculating the $A_T$ and $B_T$ for performing the method for determining a low voltage defect of a lithium secondary battery according to the present disclosure, and FIG. 5 is a table calculating the $Q_T$ for performing the method for determining a low voltage defect of a lithium secondary battery according to the present disclosure). The formulas for finding $A_T$, $B_T$ and $Q_T$ may vary depending on the characteristics of the lithium secondary battery, and are not limited to the above.

Whereas specific embodiments of the present disclosure have been illustrated and described in the above, it shall be self-evident to a person having ordinary skill in the art that the present disclosure may be improved and changed in various ways without departing from the technical idea of the present disclosure as provided by the appended claims.

What is claimed is:

1. A method for determining a low voltage defect in a lithium secondary battery, comprising:
    measuring a primary voltage of a lithium secondary battery whose formation process has been completed;
    transporting the lithium secondary battery;
    measuring temperatures to which the lithium secondary battery has been exposed during the transporting process;
    measuring a secondary voltage of a lithium secondary battery whose transporting has been completed;
    based on the temperature to which the lithium secondary battery has been exposed, revising the secondary voltage to calculate a corrected secondary voltage; and
    comparing the primary voltage and the corrected secondary voltage to determine whether the lithium secondary battery is defective.

2. The method for determining a low voltage defect in a lithium secondary battery of claim 1, wherein the primary voltage and the secondary voltage are measured in an open circuit (OC) state.

3. The method for determining a low voltage defect in a lithium secondary battery of claim 1, wherein in measuring an exposed temperature, the average temperature to which the lithium secondary battery has been exposed is measured.

4. The method for determining a low voltage defect in a lithium secondary battery of claim 1, wherein in calculating the corrected secondary voltage, a corrected secondary voltage is calculated by correcting the secondary voltage based on the average temperature to which the lithium secondary battery has been exposed.

5. The method for determining a low voltage defect in a lithium secondary battery of claim 1, wherein in calculating the corrected secondary voltage, the secondary voltage is corrected by dividing the measured secondary voltage by a correction factor (Q).

6. The method for determining a low voltage defect in a lithium secondary battery of claim 1, wherein in determining whether the lithium secondary battery is defective, the battery is determined as defective if a voltage change between the first voltage and the corrected second voltage is greater than a reference value.

* * * * *